United States Patent [19]
Cardashian et al.

[11] Patent Number: 5,126,920
[45] Date of Patent: Jun. 30, 1992

[54] MULTIPLE INTEGRATED CIRCUIT INTERCONNECTION ARRANGEMENT

[75] Inventors: Vahram S. Cardashian, Plymouth; Jerald M. Loy, Anoka, both of Minn.

[73] Assignee: Honeywell Inc., Minneapolis, Minn.

[21] Appl. No.: 764,439

[22] Filed: Sep. 23, 1991

Related U.S. Application Data

[63] Continuation of Ser. No. 418,988, Oct. 6, 1989, abandoned, and a continuation of Ser. No. 859,000, May 1, 1986, abandoned.

[51] Int. Cl.$^5$ .............................................. H05K 1/00
[52] U.S. Cl. ................................. 361/398; 174/254; 361/400
[58] Field of Search .................. 174/52.4, 254-258; 361/398, 400, 414

[56] References Cited

U.S. PATENT DOCUMENTS

| | | | |
|---|---|---|---|
| 3,780,352 | 12/1973 | Redwanz | 361/398 X |
| 3,832,769 | 9/1974 | Olyphant et al. | 361/398 X |
| 3,967,162 | 6/1976 | Ceresa et al. | 361/398 |
| 4,064,552 | 12/1977 | Angelucci et al. | 361/414 |
| 4,231,154 | 11/1980 | Gazdik et al. | 29/840 |
| 4,303,291 | 12/1981 | Dines | 174/68.5 X |
| 4,438,847 | 3/1984 | Fritz | 206/330 |
| 4,472,876 | 9/1984 | Nelson | 174/52 FP X |
| 4,480,288 | 10/1984 | Gazdik et al. | 361/398 |
| 4,484,215 | 11/1984 | Pappas | 357/80 |
| 4,587,596 | 5/1986 | Bunnell | 361/398 |

FOREIGN PATENT DOCUMENTS

| | | |
|---|---|---|
| 981797 | 1/1976 | Canada . |
| 1090003 | 11/1980 | Canada . |
| 1196425 | 11/1985 | Canada . |
| 0065425 | 11/1982 | European Pat. Off. . |
| 0178227 | 4/1986 | European Pat. Off. . |
| 2004127 | 3/1979 | United Kingdom . |

OTHER PUBLICATIONS

IBM Technical Disclosure Bulletin, vol. 24, No. 2, Jul 1981, L. V. Auletta et al.

Primary Examiner—Gregory D. Thompson
Attorney, Agent, or Firm—Gregory A. Bruns

[57] ABSTRACT

A flexible chip interconnection includes a flexible film having interconnection lines formed on opposite sides thereof, with selected of the interconnection lines from one side connected by through-film conductors to interconnection lines on the other side. Insulating layers cover both sets of interconnection lines. Multi-chip circuits can be formed on the film with the interconnection lines directly connecting the chips.

4 Claims, 2 Drawing Sheets

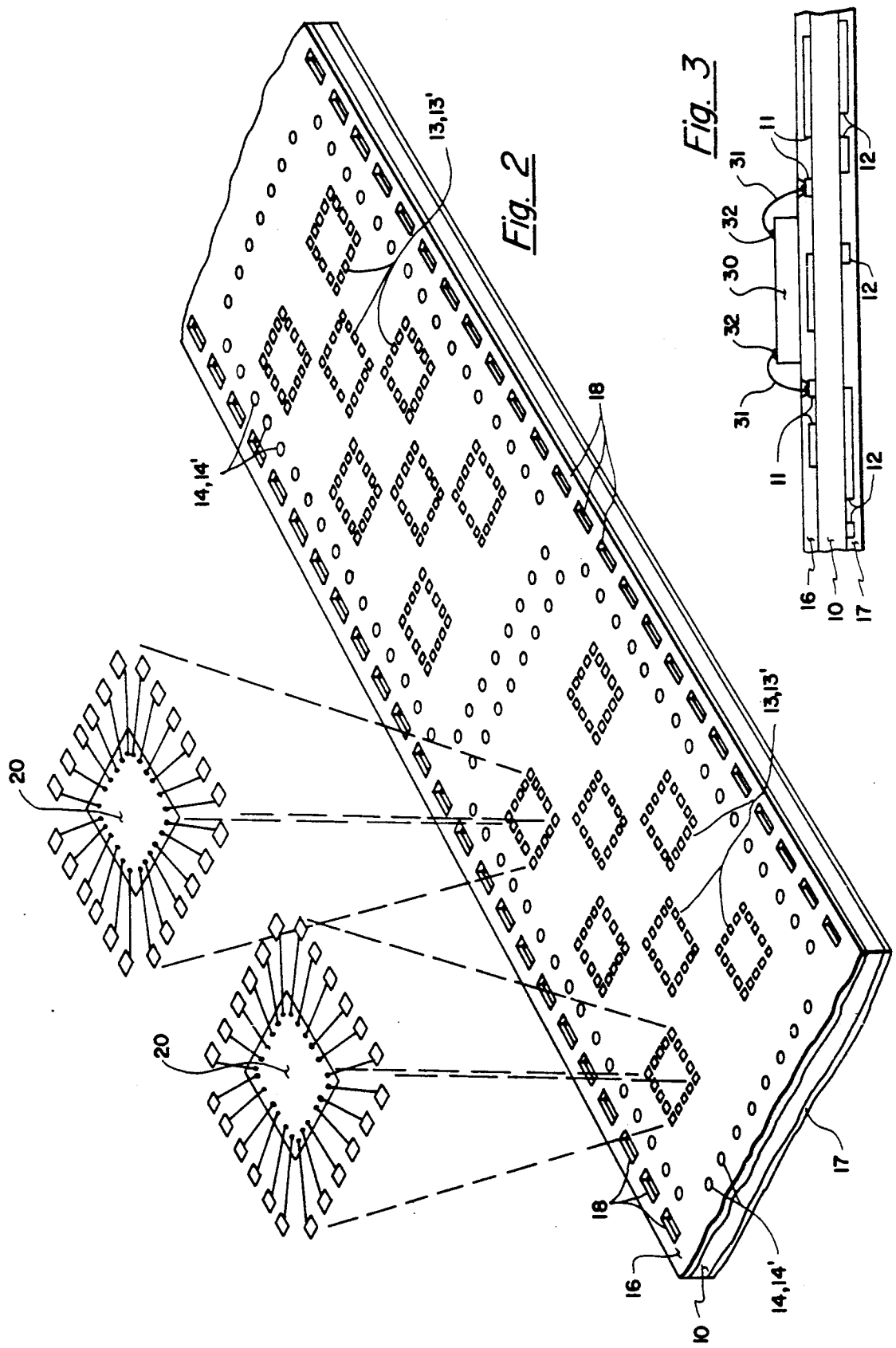

MULTIPLE INTEGRATED CIRCUIT INTERCONNECTION ARRANGEMENT

This application is a continuation of application Ser. No. 07/418,988, filed Oct. 6, 1989, now abandoned, and a continuation of application Ser. No. 859,000 filed May 1, 1986 now abandoned.

BACKGROUND OF THE INVENTION

The present invention relates to the electrical interconnecting of monolithic integrated circuits, and more particularly, to interconnecting monolithic integrated circuits in a preformed interconnection structure of only a small area.

Monolithic integrated circuits must be mounted in some mechanically secure manner during use, and must be electrically interconnected with other portions of the electronic system in which it is to operate. There is a desire to accomplish this in as little space as possible and at the lowest cost possible while assuring reliable interconnection during use in a chosen environment.

A typical approach is to mount such monolithic integrated circuit chips on a printed circuit board or on a ceramic substrate. Electrical interconnections to the chip electrical terminations are made from conductive tracks provided on the surface of such board or substrate. There are limits, however, to how closely monolithic integrated circuits can be arrayed on printed circuit boards due to limitations in printed circuit board track placement technology. Closer packing is possible on ceramic substrates, but they are relatively expensive.

The density of monolithic integrated circuits across such substrates can often be increased, and the cost of mounting and interconnecting such integrated circuits on substrates and boards can be reduced through the use of chip carrier films. Such films are of an electrical insulator material having conductive interconnections provided thereon. In each "frame" along the film, an individual monolithic integrated circuit is connected to the corresponding set of interconnectors therein which radiate into the chip often bridging an opening in the film frame interior over which the chip is provided. That is, the frame interconnections from the edges of the film around the frame opening to chip electrical interconnections, the opening being provided under the ends of the tape interconnections to which the monolithic integrated circuit is interconnected and under the chip itself.

Such a film can have many frames and so many integrated circuits contained therein, one in each frame. The film with such integrated circuits can then be provided to a bonding machine which may automatically index a frame forward for each bonding, cut the tape interconnections near the edge of the film opening, and bond the remaining ends of the tape interconnections to a board or substrate to thereby interconnect the chip in the frame thereto.

Because the tape interconnections can be made quite small, some improvement in density can be achieved at least on ceramic substrates. The use of tape carrier feed in an automatic bonding machine can aid in the reduction of cost However, greater integrated circuit packing densities are desired along with a further reduction in cost.

SUMMARY OF THE INVENTION

The present invention provides a means for interconnecting a plurality of monolithic integrated circuits through use of a flexible insulating film with electrical interconnections on either side which are themselves interconnected at selected locations through the flexible film. There is an insulating layer over each group of interconnections on either side of the flexible film with openings in the layers to permit interconnection of monolithic integrated circuits, other circuit components, or interconnections to external circuits. The insulating layer on the side opposite that to which the monolithic integrated circuits are connected is positioned beneath the connection place for such integrated circuits to support the flexible carrier during the interconnection of the integrated circuits.

BRIEF DESCRIPTION OF THE DRAWINGS

FIG. 2 shows an integrated portion of the present invention, and

FIG. 3 shows a cross section of a portion of FIG. 2.

DESCRIPTION OF THE PREFERRED EMBODIMENTS

Figure 1:
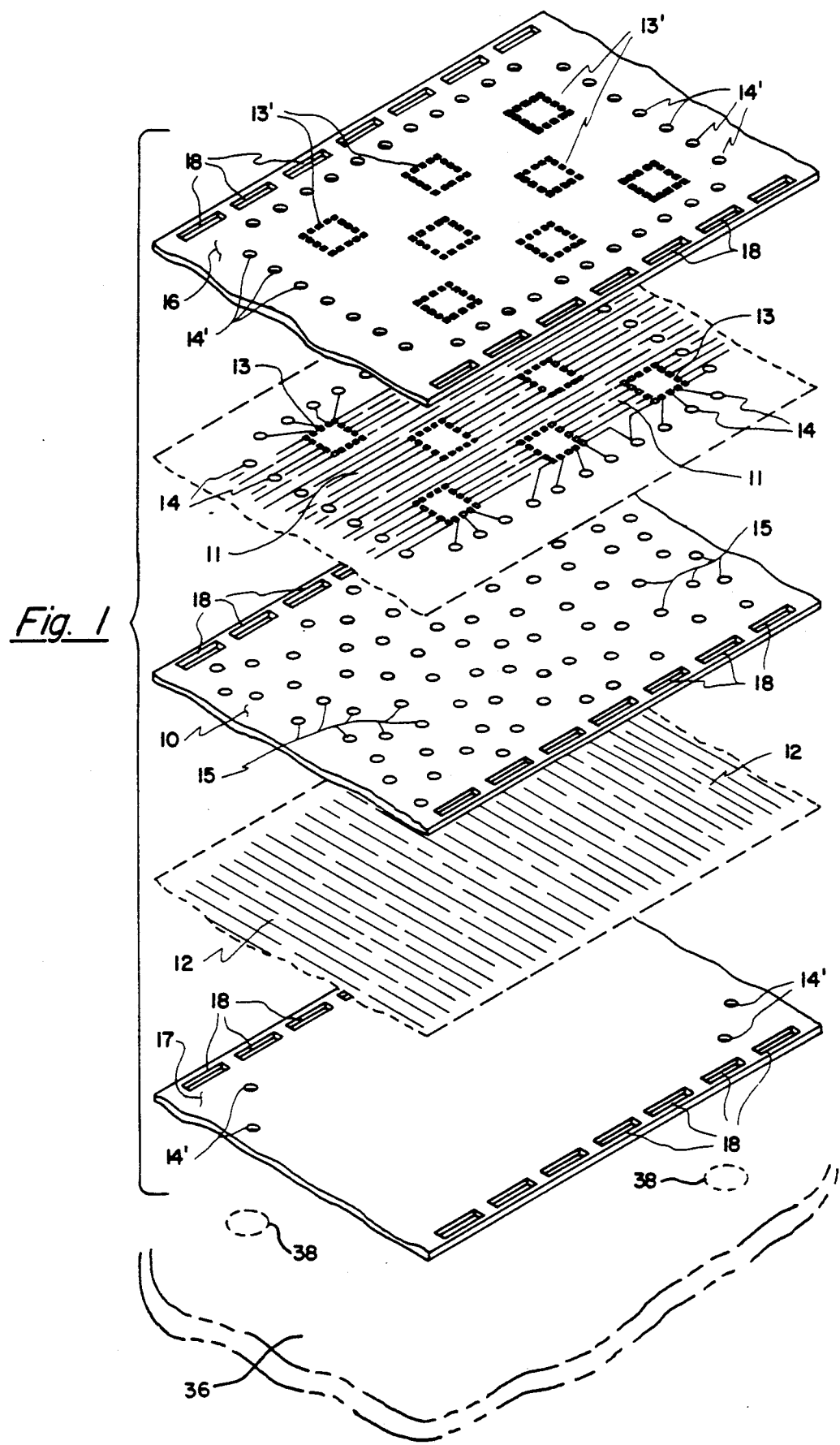
FIG. 1 shows an exploded view of a portion of the present invention.

FIG. 1 shows an exploded view of levels of a flexible, electrical interconnection means for monolithic integrated circuits and possibly other circuit components. If to be provided as part of a tape, the portion shown would be a "frame" in such tape. The tape would consist of a repeated number of such frames.

At the center or core of the interconnection means is a polyimide film, 10, which is the flexible electrical insulating material. This film is typically one or two mils in thickness. Again, if the portion of such film shown is in the form of a tape, this portion would repeat and these duplicates would extend in an elongated fashion to the right and to the left of the break lines shown. However, though the structure shown in FIG. 1, and that in FIG. 2 for that matter, suggest the interconnection means in the form of a tape, a form which is very convenient, the interconnection means could be provided in the form of a sheet having repeated patterns extending in more than one or two directions.

Adhering to a major surface on each side of film 10 are a group of fine conductive interconnection lines or interconnections, a first group, 11, shown above film 10 and a second group., 12, shown below film 10. These are shown with dashed lines around them to suggest there is a layer devoted to each group, but the interconnections are independent from each other within the group with which there is no actual physical conductive contact.

The interconnections in group 11 are shown drawn all in one direction as they are in group 12 also in an orthogonal direction, but this is a matter of design convenience and is not necessarily the only geometrical pattern which could be used. Group 11 shows an interconnection pattern 13 in several places, adapted for accepting interconnections of monolithic integrated circuits. Note that some of the interconnections in group 11 form direct contacts between different interconnection patterns 13. Thus, upon the connection of monolithic integrated circuit chips to the interconnection patterns 13, some of the chips may be directly connected by the interconnections in group 11. Multichip circuits can thus be provided within one frame of the tape, with various chips combining to provide an expanded function or with different functions provided by various of the chips. Furthermore, group 11 also shows a series of interconnection terminals, 14, along the sides thereof suitable for use in connecting to external circuits Such external circuit interconnections can also be made by the group 12 interconnections.

Typically, each of the interconnections in groups 11 and 12 are formed of copper over chromium with the chromium adhering to film 10. Each interconnection may be as fine as two mils wide with a spacing of again two mils from one another, edge to edge. Such fine interconnection lines and close spacing are provided using common metal deposition and photolithography techniques. For instance, the sputtering of chromium and some copper onto film 10 can be followed by electroplating the remaining copper to the desired thickness. Then, using photolithography methods common in intergrated circuit fabrication, the patterns for each of the interconnections in groups 11 and 12 can be defined and formed. Selected registration markings may be provided in the same manner, such markings being used to determine relative positions on either side of film 10.

In addition, selected interconnections in group 11 are electrically interconnected to selected interconnections in group 12 through electrical conductors provided in openings, 15, in film 10. If desired, one can thus directly connect two chips located at interconnection patterns 13 by way of selected interconnections in group 11, openings 15 and selected interconnections in group 12. Of course, the multi-chip circuits described above with regard to interconnections, can be provided with direct connections between chips being completed by utilizing interconnections 13, or both 11 and 12. Copper is plated through these openings to provide such through-film interconnections.

Protecting each of interconnection groups 11 and 12, and also electrically insulating these groups from external items, except as desired through openings provided in these layers, are protective layers. The upper one of these protective layers, 16, is over group 11 and on exposed portions of the corresponding major surface of film 10. The lower one of these protective layers, 17, is over group 12 and on exposed portions of the corresponding major surface of film 10. Protective layers 16 and 17 are of flexible electrical insulating material, again typically polyimide. Openings are provided in protective layers 16 and 17 to accommodate providing interconnections to "interconnection patterns" 13, for monolithic integrated circuit chips, and to terminations 14, including those terminations occurring below the interconnections in group 12, for providing interconnections to external circuits. These openings in protective layer 16 are designated 13' and 14' in accordance with the terminations in interconnection group 11. Similarly, there are some openings provided for external connection through protective layer 17 also designated 14' which correspond to terminations in interconnection group 12.

Further shown in FIG. 1, for the situation in which the interconnection means portion of FIG. 1 is part of a tape, are sprocket holes, 18, for sprockets to drive the tape in a machine adapted for use in combining the portion shown in FIG. 1 into a next higher assemblage in a manufacturing process. Sprocket holes 18 are precisely located with respect to the patterns of interconnections in FIG. 1 including those of group 11 and 12, and with the openings, 15 for interconnections in film 10. Thus, control means driving such sprockets in such a machine can precisely position such a tape along the direction this tape is driven by them.

A typical next assembly for such an interconnection means once the monolithic integrated circuit components have been mounted thereon, along with any other circuit components to be also mounted, would be to provide this interconnection means on a printed wiring board 36 having external circuit connections 38 or on a ceramic substrate. Other circuits on such a board or substrate could then be interconnected to those in the integrated circuit means of FIG. 1 by interconnections from terminations 14 to such circuits. Because of the very dense packing of monolithic integrated circuits and other circuit components which can be achieved with the interconnection means of FIG. 1, a printed circuit board or a ceramic substrate having such interconnection means used thereon would have thereon a considerable increase in circuit component density over that which could be otherwise achieved on such a board, and a decrease in cost over what could be achieved with such a substrate.

FIG. 2 shows as an integrated item the exploded view portion of FIG. 1, with the layers of FIG. 1 formed into a full series of interconnection means in abbreviated tape form. FIG. 2 indicates monolithic integrated circuits chips, 20, to be mated and interconnected to such an interconnection means with a form suggesting thermocompression bonding of these chips. However, other bonding technologies can be used, such as ultrasonic bonding. The patterns of FIG. 1 are then repeated as "frames" along the tape repeated across the sheet. Additional protective coatings or structures, including electrically insulating ones, can be provided on or over chips 20 or over other kinds of electrical circuit components mounted on the interconnection means.

FIG. 3 is a cross section of a portion of FIG. 2 at a location that is the place of mounting a monolithic integrated circuit chip, 30, in the interconnection means by thermocompression bonding. Protective layer 17 fully fills in about the interconnections of interconnection group 12 to provide firm support under chip 30 during bonding of the wire interconnection leads, 31, between the chip electrical termination, 32, and interconnections in interconnection group 11.

The embodiments of the invention in which an exclusive property or right is claimed are defined as follows:

1. A self-contained integrated circuit interconnect package adapted to be incorporated into an electrical or electromechanical device, wherein the device includes a printed wiring board with circuit connecting means for connecting to said package, comprising:

a flexible, thin electrical insulating film, having first and second openings therethrough, and having first and second oppositely disposed surfaces;

a first set of electrical interconnection lines, located on said first surface and including first and second integrated circuit connection sites;

a second set of electrical interconnection lines located on said second surface;

first and second electrical insulating layers covering said first and second surfaces, respectively, except at selected contact locations;

first and second integrated circuits, wherein said first integrated circuit is connected to said first integrated circuit connection cite by wire bonds, and said second integrated circuit is connected to said second integrated circuit site by wire bonds;

a set of interconnections for external circuits on said second surface, wherein some of said interconnections for external circuits are electrically connected to at least one of said first set of electrical interconnection lines or to at least one of said second set of electrical interconnection lines;

first and second electrical connection through-films, located respectively in said first and second openings, wherein said through-films connect at least one of said first set of electrical interconnections which is connected to said first site to at least one of said second set of electrical interconnections which is connected to said second site, by way of at least one said second set of electrical interconnection lines, to thereby provide an electrical signal path between said intergrated circuit connection sites; and wherein some of said interconnections for external circuits are adapted to be directly connected to the circuit connecting means.

2. The package of claim 1 wherein said wire bonds are formed by thermo-compression bonding.

3. The package of claim 1 wherein said wire bonds are formed by ultrasonic bonding.

4. The package of claim 1 wherein the majority of said interconnection lines are no more than 2 mils wide, and some of said interconnection lines are spaced as close as 2 mils, edge to edge.

* * * * *